(12) United States Patent
Chatterjee et al.

(10) Patent No.: US 6,307,230 B1
(45) Date of Patent: Oct. 23, 2001

(54) TRANSISTOR HAVING AN IMPROVED SIDEWALL GATE STRUCTURE AND METHOD OF CONSTRUCTION

(75) Inventors: Amitava Chatterjee; Wei William Lee, both of Plano; Greg A. Hames, Dallas; Quzhi He, Plano, all of TX (US); Iqbal Ali, San Jose, CA (US); Maureen A. Hanratty, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/416,380

(22) Filed: Oct. 12, 1999

Related U.S. Application Data

(62) Division of application No. 09/226,237, filed on Jan. 5, 1999.

(51) Int. Cl.[7] .................................................. H01L 29/76
(52) U.S. Cl. .......................... 257/327; 257/394; 257/547; 438/300
(58) Field of Search ........................ 438/300; 257/327, 257/394, 547, 900

(56) References Cited

U.S. PATENT DOCUMENTS

| | | | |
|---|---|---|---|
| 4,948,745 | * | 8/1990 | Pfiester et al. .................... 438/290 |
| 5,118,639 | * | 6/1992 | Roth et al. ......................... 438/300 |
| 5,168,072 | * | 12/1992 | Moslehi ............................. 438/300 |
| 5,252,501 | * | 10/1993 | Moslehi ............................. 437/34 |
| 5,824,587 | * | 10/1998 | Krivokapic ......................... 438/300 |
| 5,902,125 | * | 5/1999 | Wu .................................... 438/300 |
| 6,160,299 | * | 12/2000 | Rodder .............................. 257/408 |

* cited by examiner

*Primary Examiner*—Carl Whitehead, Jr.
*Assistant Examiner*—Jeff Vockrodt
(74) *Attorney, Agent, or Firm*—Peter K. McLarty; W. James Brady, III; Frederick J. Telecky, Jr.

(57) ABSTRACT

A transistor having an improved sidewall gate structure and method of construction is provided. The improved sidewall gate structure may include a semiconductor substrate (12) having a channel region (20). A gate insulation (36) may be adjacent the channel region (20) of the semiconductor substrate (12). A gate (38) may be formed adjacent the gate insulation (36). A sidewall insulation body (28) may be formed adjacent a portion of the gate (38). The sidewall insulation body (28) is comprised of a silicon oxynitride material. An epitaxial layer (30) may be formed adjacent a portion of the sidewall insulation body (28) and adjacent the semiconductor substrate (12) substantially outward of the channel region (20). A buffer layer (32) may be formed adjacent a portion of the sidewall insulation body (28) and adjacent the epitaxial layer (30).

1 Claim, 2 Drawing Sheets

TRANSISTOR HAVING AN IMPROVED SIDEWALL GATE STRUCTURE AND METHOD OF CONSTRUCTION

CROSS REFERENCE TO PRIOR APPLICATIONS

This application is a divisional of prior application Ser. No. 09/226,237 filed Jan. 5, 1999.

TECHNICAL FIELD OF THE INVENTION

This invention relates generally to the field of electronic devices, and more particularly to a transistor having an improved sidewall gate structure and method of construction.

BACKGROUND OF THE INVENTION

Electronic equipment such as televisions, telephones, radios, and computers are often constructed using semiconductor components, such as integrated circuits, memory chips, and the like. The semiconductor components are constructed from various microelectronic devices, such as transistors, capacitors, diodes, resistors, and the like. Each microelectronic device is generally constructed from a pattern of conductor, semiconductor, and insulator regions that are formed on a semiconductor substrate.

A Field Effect Transistor (FET) generally includes a conductive gate formed near the semiconductor substrate to control the flow of current from a source to a drain of the transistor. One type of FET utilizes a raised source and drain to increase the amount of current that can be switched by the transistor. A sidewall insulation body formed between the gate and the raised source and drain is used to prevent the gate from shorting to the raised source and drain. The gate in combination with the sidewall insulation body and the raised drain generally forms an unwanted parasitic capacitance, often referred to in the art as a gate-to-drain capacitance.

As the geometries of microelectronic devices decrease and the density of the microelectronic devices in a semiconductor component increase, the distance between the gate and the drain of the transistor decreases, resulting in a corresponding increase in the gate-to-drain capacitance. The higher the gate-to-drain capacitance, the greater the adverse affect on the operation of the transistor. For example, the higher the gate-to-drain capacitance, the slower the switching speed of the transistor.

In addition, some gate fabrication techniques utilize an etching process, such as plasma etching or wet chemical etching, to chemically remove material to form the microelectronic devices. Some etching processes used in fabricating the gate removes material that would otherwise be beneficial to the construction or operation of the microelectronic device. The loss of the beneficial material during the etching process can reduce the manufacturability or operating ability of the gate, transistor, semiconductor component, and the electronic equipment.

SUMMARY OF THE INVENTION

Accordingly, a need has arisen in the art for a transistor having an improved sidewall gate structure and method of construction. The present invention provides a transistor having an improved sidewall gate structure and method of construction that substantially eliminates or reduces problems associated with the prior devices and methods.

In accordance with one embodiment of the present invention, a method of forming a sidewall gate structure comprises forming a primary insulation layer adjacent a substrate. The substrate includes a first and second doped region separated by a channel region. A disposable gate is formed adjacent to the primary insulation layer proximate the channel region of the substrate. A sidewall insulation body is then formed adjacent to the disposable gate. The sidewall insulation body is comprised of a silicon oxynitride (oxynitride) material. The primary insulation layer proximate the first and second doped regions is removed to expose a portion of the substrate. An epitaxial layer is formed on the exposed portion of the substrate and a buffer layer is then formed outwardly from the epitaxial layer. The disposable gate is removed to expose a portion of the primary insulation layer proximate the channel region of the substrate. The exposed portion of the primary insulation layer is removed to expose the channel region of the substrate. The sidewall insulator body is not etched substantially by the same etch process that etches the primary insulation layer. A gate insulator is formed on the exposed channel portion of the substrate. A gate is then formed adjacent the gate insulator.

Important technical advantages of the present invention include providing an improved gate structure having a sidewall insulating body formed from an oxynitride material. The oxynitride material has the technical advantage of having a lower dielectric constant than many conventional materials used in sidewall insulation bodies. Accordingly, the gate-to-drain parasitic capacitance of the transistor may be reduced and the transistor can switch at a higher speed.

Another technical advantage of the present invention is that the buffer layer is not substantially removed during subsequent etching processes. Accordingly, the transistor may have an increased resistance to charge leakage and shorting between the gate and the source or drain.

Other technical advantages will be readily apparent to one skilled in the art from the following figures, description, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

FIGS. 1A through 1J illustrate the fabrication of a transistor having an improved sidewall gate structure. As described in greater detail below, the improved sidewall gate structure may be fabricated using a dielectric material that is not substantially etched when the primary insulation layer is etched. Thus, the buffer layer is not substantially reduced in thickness during the gate fabrication process. In addition, the sidewall is formed from oxynitride, which decreases the parasitic gate-to-drain capacitance of the transistor. Accordingly, the switching speed of the transistor may be increased.

Figure 1A:
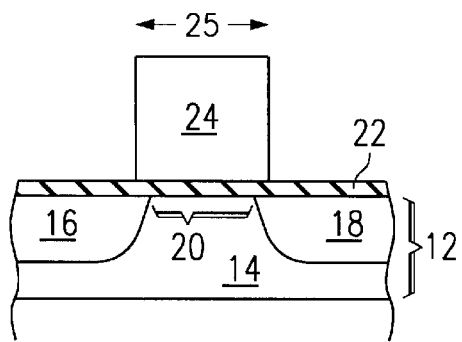
FIGS. 1A through 1J are a series of schematic cross-sectional diagrams illustrating the fabrication of a transistor having an improved sidewall gate structure in accordance with the present invention.

FIG. 1A illustrates an initial semiconductor structure having a substrate 12. In one embodiment, the substrate 12 comprises a wafer 14 formed from a single-crystalline silicon material. It will be understood that the substrate 12 may comprise other suitable materials or layers without departing from the scope of the present invention. For example, the substrate 12 may include an epitaxial layer, a recrystallized semiconductor material, a polycrystalline semiconductor material, or any other suitable semiconductor material.

As illustrated in FIG. 1A, the substrate 12 may comprise a first doped region 16 and a second doped region 18 separated by a channel region 20. Doped regions 16 and 18 comprise portions of the substrate 12 into which impurities have been introduced to form a conductive region. The doped regions 16 and 18 may be formed by ion implantation of impurities into the substrate 12 or by other conventional doping processes. It will be understood that the doped regions 16 and 18 may be formed at other times during the fabrication process without departing from the scope of the present invention.

An optional primary insulation layer 22 may be formed outwardly from the substrate 12. The primary insulation layer 22 may be on the order of 30 Å to 150 Å in thickness. The primary insulation layer 22 may comprise, for example silicon dioxide, silicon nitride, or other materials suitable for insulating semiconductor elements.

A disposable gate 24 is formed outwardly from the substrate 12 proximate the channel region 20. In one embodiment, the primary insulation layer 22 is disposed between the disposable gate 24 and the substrate 12. A gate width indicated generally at 25 is associated with the disposable gate 24. The disposable gate 24 is formed with the width 25 generally on the order of 0.1 $\mu$m and a thickness generally on the order of 0.2 $\mu$m, respectively.

As described in greater detail below, the disposable gate 24 is disposable in that it is subsequently removed during the fabrication process. The disposable gate 24 is formed using conventional photolithographic and selective etching processes. The disposable gate 24 may comprise a suitable material such that the disposable gate 24 is readily removable with respect to the primary insulation layer 22. In other words, the removal process to remove the disposable gate 24 must readily remove the material comprising the disposable gate 24 without substantially removing the material comprising the other elements of the transistor. For example, in one embodiment the primary insulation layer 22 is formed from a silicon dioxide material and the disposable gate 24 is formed from a polycrystalline silicon (polysilicon) material. In another embodiment, the primary insulation layer 22 is formed from a silicon dioxide material and the disposable gate 24 is formed from a silicon nitride material.

Figure 1B:
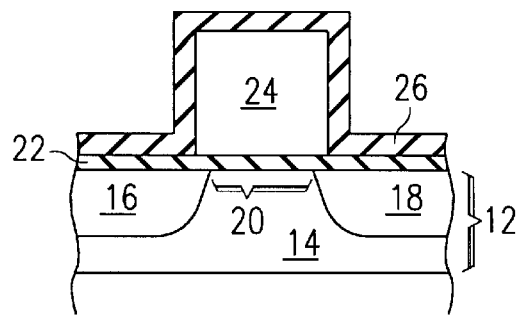

Referring to FIG. 1B, a sidewall layer 26 is formed covering the primary insulation layer 22 and the disposable gate 24. The thickness of the sidewall layer 26 may be on the order of 150 Å. In one embodiment, the sidewall layer 26 is comprised of a silicon oxynitride alloy (oxynitride). The oxynitride sidewall layer 26 is formed by Chemical Vapor Deposition (CVD) or by Physical Vapor Deposition (PVD), such as sputtering. It will be understood that the sidewall layer 26 may comprise other suitable dielectric materials without departing from the scope of the present invention. For example, the sidewall layer 26 may comprise silicon nitride.

Figure 1C:
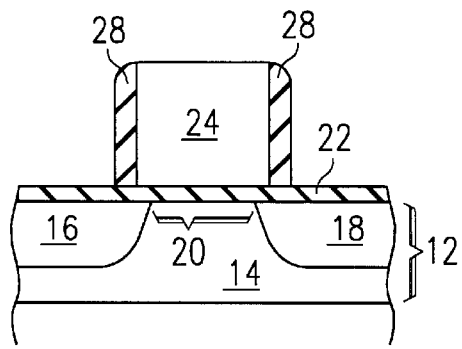

Referring to FIG. 1C, the sidewall layer 26 is anisotropically etched to form a sidewall insulation body 28 adjacent the disposable gate 24. Anisotropic etching may be performed using a reactive ion etch (RIE) process using carbon fluorine-based gases such as $CF_4$ or $CHF_3$. It will be understood that the sidewall layer 26 may be otherwise removed to form the sidewall insulation body 28 without departing from the scope of the present invention.

The oxynitride material forming the sidewall insulation body 28 may be thermally treated to vary the etch rate of the oxynitride sidewall insulation body 28 with respect to the etch rate of other materials, such as the material comprising the primary insulation layer 22 and the disposable gate 24. Table 1 below provides examples of some of the thermal treatments and etch rates that may be utilized with oxynitride. For example, in one embodiment the oxynitride material is annealed at 800° centigrade for 20 minutes. In this embodiment, the amount of oxynitride etched in a 4.9% HF solution for 60 seconds is reduced from 140 Å to 21 Å. In another embodiment, the oxynitride material is subjected to Rapid Thermal Annealing (RTA) at 1,000° centigrade for 15 seconds. In this embodiment, the amount of oxynitride etched in a hot phosphoric acid solution for 5 minutes is reduced from 245 Å to 30 Å. it will be understood that the oxynitride may be otherwise thermally treated and etched without departing from the scope of the present invention. Table 1 illustrates some of the various thermal treatments and etch processes that may be used with oxynitride.

TABLE 1

SAMPLE ETCH RATES

| 4.9% HF for 60 Seconds | | | Hot Phosphoric Acid for 5 Minutes | | |
|---|---|---|---|---|---|
| Material | Thermal Treatment | Total Etched (Å) | Material | Thermal Treatment | Total Etched (Å) |
| Silicon Dioxide | None | 284 | Silicon Nitride | None | 250 |
| Oxynitride | None | 140 | Oxynitride | None | 245 |
| Oxynitride | 800° C. 20 Min. | 21 | Oxynitride | 800° C. 20 Min. | 30 |
| Oxynitride | 1,000° C. 15 Sec. | 12 | Oxynitride | 1,000° C. 15 Sec. | 30 |
| Oxynitride | 800° C./20 Min. 1,000° C./15 Sec. | 35 | Oxynitride | 800° C. 20 Min. 1,000° C./15 Sec. | 30 |

The oxynitride material forming the sidewall insulation body 28 has a dielectric constant of approximately 4.8. This dielectric constant is approximately one-half of the dielectric constant of the silicon nitride used in a sidewall insulation body of some transistors. The lower dielectric constant of the sidewall insulation body 28 reduces the parasitic source-to-drain capacitance formed between the gate and the drain in a transistor comprising a raised source and drain. Reducing the parasitic source-to-drain capacitance has become increasingly important as semiconductor devices are scaled down to sub-micron sizes. The reduction in the parasitic capacitance increases the switching speed and efficiency of the transistor.

Figure 1D:
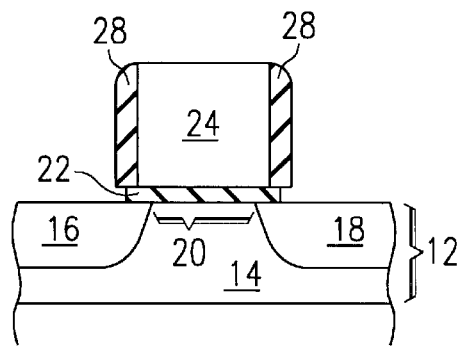

Referring to FIG. 1D, the primary insulation layer 22 proximate the doped regions 16 and 18 of the substrate 12 is removed to expose a portion of the substrate 12. Thus, the primary insulation layer 22 disposed between the channel region 20 of the substrate 12 and the disposable gate 24 is not removed. The removal process to remove the primary insulation layer 22 is selective to the primary insulation layer 22 and is non-selective to the material forming the disposable gate 24 and the oxynitride forming the sidewall insulation body 28. In addition, the removal process to remove the primary insulation layer 22 is non-selective to the substrate 12. In other words, the removal process will readily remove the material comprising the primary insulation layer 22 without substantially removing the material comprising the substrate 12, disposable gate 24, or the sidewall insulation body 28. In an embodiment in which the primary insulation layer 22 comprises a silicon dioxide material, the primary insulation layer 22 can be removed by a wet etch solution of 4.9% HF. As discussed previously, the oxynitride may be thermally treated to reduce the etch rate of the oxynitride during the etching process of the primary insulation layer 22. Table 1, as discussed previously, provides various sample etch rates for different chemical etch processes and for varying thermal treatments of oxynitride. It will be understood that the etching process to remove the primary insulation layer 22 may include other etching processes without departing from the scope of the present invention.

Figure 1E:
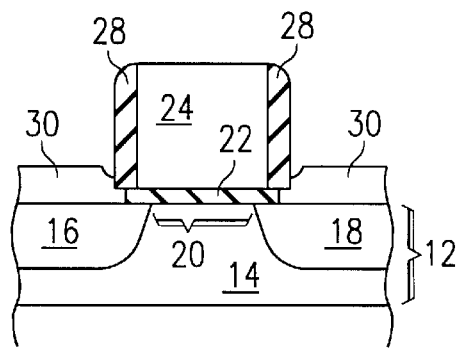

Referring to FIG. 1E, an epitaxial layer 30 is formed on the exposed portion of the substrate 12 proximate the doped regions 16 and 18. The epitaxial layer 30 is on the order of 0.03 µm in thickness. The epitaxial layer 30 is a single-crystalline silicon material selectively grown on the exposed portion of the substrate 12.

The epitaxial layer 30 is doped with impurities to form raised conductive regions corresponding to the doped regions 16 and 18. The epitaxial layer 30 may be doped with impurities in situ as the epitaxial layer 30 is grown or by other conventional doping processes such as ion implantation.

The raised conductive regions formed by the epitaxial layer 30 in conjunction with the doped regions 16 and 18 form a raised source and drain for the transistor. The raised source and drain allow the transistor to switch a greater amount of electrical current between the source and drain. The raised conductive regions also have other known benefits, such as reducing the undesirable short-channel effects.

Figure 1F:
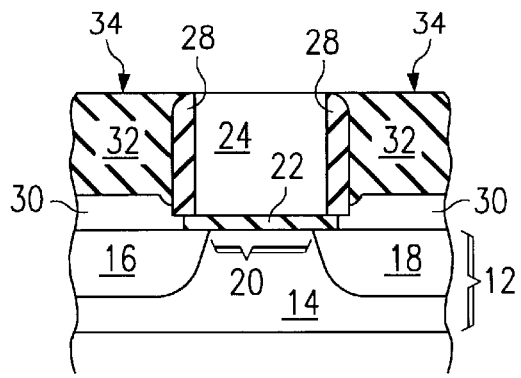

Referring to FIG. 1F, a buffer layer 32 is formed outwardly from the epitaxial layer 30. The buffer layer 32 is formed by depositing the buffer layer 32 over the epitaxial layer 30 and the disposable gate 24. The buffer layer 32 may be deposited by Chemical Vapor Deposition (CVD) or Physical Vapor Deposition (PVD), such as sputtering. A portion of the buffer layer 32 is then removed by Chemical-Mechanical Polish (CMP) to expose at least a portion of the disposable gate 24. It will be understood that other removal processes may be used without departing from the scope of the present invention.

The buffer layer 32 may comprise any suitable dielectric material for insulating semiconductor elements. In one embodiment, the buffer layer 32 comprises an oxynitride material In another embodiment, the buffer layer 32 includes multiple layers such that a top surface 34 is formed from oxynitride. As previously described, the oxynitride material may be thermally treated to reduce the etch rate of the oxynitride with respect to the etch rate of other materials, such as the material comprising the primary insulation layer 22 or the disposable gate 24.

Figure 1G:
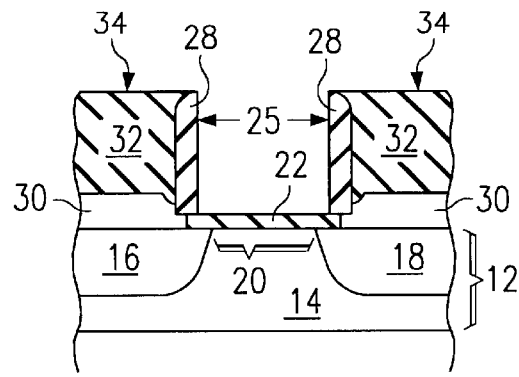

Referring to FIG. 1G, the disposable gate 24 may be removed to expose the primary insulation layer 22 corresponding to the channel region 20 of the substrate 12. The process to remove the disposable gate 24 is selective to the disposable gate and non-selective to the material forming the sidewall isolation body 28 and the top surface 34 of the buffer layer. In addition, the disposable gate 24 removal process is non-selective to the material forming the primary insulation layer. In other words, the etch process to remove the disposable gate 24 will readily remove the material comprising the disposable gate 24 without substantially removing the material comprising the primary insulation layer 22, the top surface 32 of the buffer layer 30, or the sidewall insulation body 28. In an embodiment in which the disposable gate 24 comprises a polysilicon material, the disposable gate 24 may be removed by a wet chemical etching process using choline. In an embodiment in which the disposable gate comprises a nitride material, the disposable gate 24 may be removed by a wet chemical etching process using hot phosphoric acid. It will be understood that the disposable gate 24 may be removed by other suitable processes without departing from the scope of the present invention.

Figure 1H:
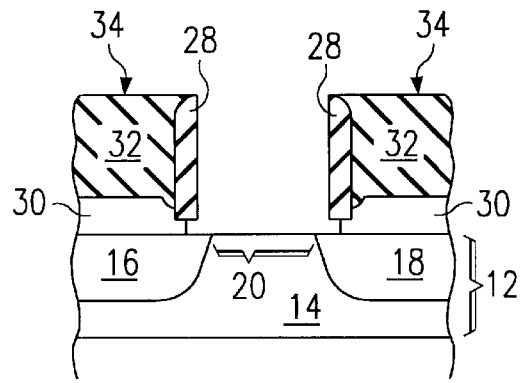

Referring to FIG. 1H, the exposed portion of the primary insulation layer 22 is removed to expose the channel region 20 of the substrate 12. The removal process to remove the primary insulation layer 22 is selective to the primary insulation layer 22 and is non-selective to the sidewall insulation body 28, the top surface 34 of the buffer layer 32, and the substrate 12. In other words, the removal process readily removes the material comprising the primary insulation layer 22 without substantially removing the material comprising the sidewall insulation body 28, the top surface 34 of the buffer layer 32, or the substrate 12.

In an embodiment in which the sidewall insulation body 28 and the top surface 34 of the buffer layer 32 comprise oxynitride, and the primary insulation layer 22 comprises silicon dioxide, the primary insulation layer 22 of oxide may be removed by a 4.9% HF wet etch process. It will be understood that the etching process to remove the primary insulation layer 22 may include other processes without departing from the scope of the present invention.

Figure 1I:
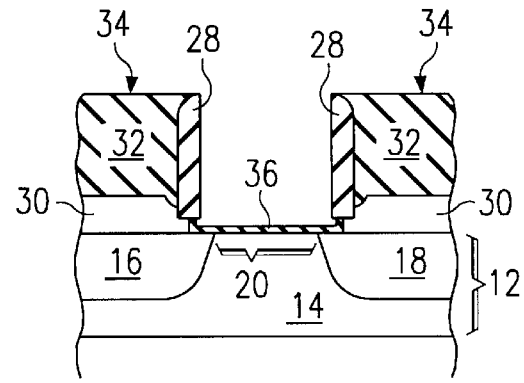

Referring to FIG. 1I, a gate insulator 36 is formed on the exposed portion of the substrate 12. The gate insulator 36 may be on the order of 15 Å to 150 Å in thickness. The gate insulator 36 forms an electrical insulator between the channel region 20 of the substrate 12 and the first and second doped region 16 and 18 of the substrate 12. In one embodiment, the gate insulator 36 comprises silicon dioxide. In this embodiment, the silicon dioxide gate insulator 30 is generally grown on the substrate 12 by reacting oxygen .with the exposed portion of the substrate 12. The reaction is carefully controlled in an environment such that the reaction forms substantially pure silicon dioxide having the requisite thickness. The thickness of the silicon dioxide may be varied to change the electrical insulating properties of the gate insulator 36. It will be understood that the gate insulator 36 may comprise other dielectric materials capable of electrically insulating semiconductor elements without departing from the scope of the present invention. For example, the gate insulator 36 may comprise a deposited insulator such as nitride or tantalum oxide, a nitride dielectric formed by means such as remote plasma nitridation or other conventional nitridation processes, or any other suitable insulating material.

Figure 1J:
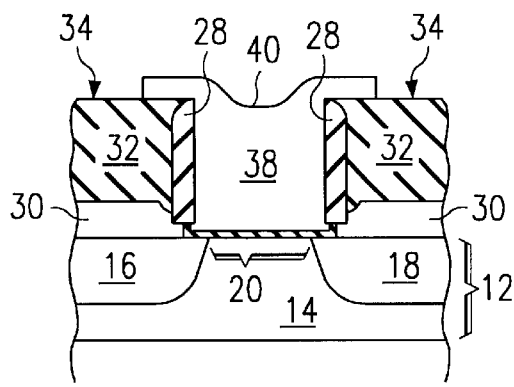

Referring to FIG. 1J, a gate 38 is formed outwardly from the gate insulator 36. The gate 38 includes a gate contact surface 40 for connecting the gate 38 to other microelectronic devices formed on the substrate 12. In one embodiment and as illustrated in FIG. 1J, the gate 38 has the configuration of a T-gate. In this embodiment, the T-gate 38 is formed by conventional photolithography and pattern etching processes. For example, a gate layer (not shown) is deposited by a CVD or PVD process. A photoresist material (not shown) is then applied over the gate layer and exposed to a pattern of light. The photoresist material is cured by the light and hardens to form a pattern of photoresist material. The patterned gate layer is then etched anisotropically such that the photoresist protects the gate material disposed under the photoresist material. The T-gate 38 is formed by that portion of the gate layer that is remaining after the anisotropic etch process.

In another embodiment, the gate 38 may be planarized to form a slot gate 38 (not shown). In this embodiment, the gate layer is deposited as described above. The gate layer is then subjected to a Chemical-Mechanical Polish (CMP) process to remove the gate layer and expose the buffer layer 32. The remaining portion of the gate layer forms the slot gate 38. It will be understood that the gate 38 may be otherwise configured without departing from the scope of the present invention.

The gate 38 may comprise any suitable conducting material or combination of materials. In one embodiment, the gate contact 32 comprises a metallic material such as platinum or aluminum. In another embodiment, the gate 38 comprises a polysilicon material that is sufficiently doped in situ, as it is deposited, so as to render it conductive. It will be understood that the gate 38 may comprise other conducting materials and heterogeneous stacks of conducting materials without departing from the scope of the present invention. For example, the gate 38 may comprise a layered stack of tungsten and tungsten silicide.

The disposable gate 24 allows the gate 38 to be fabricated with a smaller gate width 25 without sacrificing the size of the contact surface of the gate 38. This allows the transistor to be reduced in size while maintaining the size of the contact surface 40 for interconnecting other microelectronic devices. It will be understood that the disposable gate 24 is not necessarily removed during the fabrication of a transistor in accordance with the present invention.

Although the present invention has been described with several embodiments, various changes and modifications may be suggested to one skilled in the art. It is intended that the present invention encompass such changes and modifications that follow within the scope of the appended claims.

What is claimed is:

1. A transistor comprising:

a semiconductor substrate having a channel region;

a gate insulation adjacent the channel region of the semiconductor substrate;

a gate adjacent the gate insulation;

a sidewall insulation body adjacent a portion of the gate, the sidewall insulation body comprising a silicon oxynitride material;

an epitaxial layer adjacent a portion of the sidewall insulation body and adjacent the semiconductor substrate substantially outward of the channel region; and a buffer layer adjacent a portion of the sidewall insulation body and adjacent the epitaxial layer wherein the buffer layer comprises a silicon oxynitride material.

* * * * *